United States Patent
Hermes et al.

(10) Patent No.: US 11,840,445 B2
(45) Date of Patent: Dec. 12, 2023

(54) MEMS SENSOR INCLUDING A DIAPHRAGM AND METHOD FOR MANUFACTURING A MEMS SENSOR

(71) Applicant: Robert Bosch GmbH, Stuttgart (DE)

(72) Inventors: Christoph Hermes, Kirchentellinsfurt (DE); Kerrin Doessel, Stuttgart (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 347 days.

(21) Appl. No.: 17/281,508

(22) PCT Filed: Dec. 17, 2019

(86) PCT No.: PCT/EP2019/085658
§ 371 (c)(1),
(2) Date: Mar. 30, 2021

(87) PCT Pub. No.: WO2020/127271
PCT Pub. Date: Jun. 25, 2020

(65) Prior Publication Data
US 2022/0041428 A1    Feb. 10, 2022

(30) Foreign Application Priority Data

Dec. 21, 2018 (DE) .......................... 102018222758.6

(51) Int. Cl.
*B81B 3/00* (2006.01)
*B81C 1/00* (2006.01)

(52) U.S. Cl.
CPC .......... *B81B 3/001* (2013.01); *B81C 1/00968* (2013.01); *B81B 2203/0127* (2013.01); *B81B 2203/04* (2013.01)

(58) Field of Classification Search
CPC ............ B81B 3/001; B81B 2203/0127; B81B 2203/04; B81B 2201/0257;
(Continued)

(56) References Cited

U.S. PATENT DOCUMENTS 6,460,234 B1    10/2002 Gianchandani
2007/0047746 A1    3/2007 Weigold et al.
(Continued)

FOREIGN PATENT DOCUMENTS

DE    102016107275 A1    10/2016
EP    1098719 A1    5/2001
(Continued)

OTHER PUBLICATIONS

International Search Report for PCT/EP2019/085658 dated Mar. 30, 2020.

*Primary Examiner* — Yasser A Abdelaziez
(74) *Attorney, Agent, or Firm* — NORTON ROSE FULBRIGHT US LLP; Gerard Messina

(57) ABSTRACT

A MEMS sensor including a diaphragm, a base surface area of the diaphragm being delimited with the aid of a peripheral wall structure, and the base surface area including at least two subareas, of which at least one of the subareas is deflectably situated, and the at least two subareas being separated from one another with the aid of at least one separating structure or being delimited by the latter. The separating structure includes at least one fluid through-opening for the passage of fluid.

12 Claims, 5 Drawing Sheets

(58) Field of Classification Search
CPC .............. B81B 2201/0264; B81B 7/04; B81B 2203/0315; B81C 1/00968; B81C 1/00047; G01L 9/0042; G01L 9/0073
See application file for complete search history.

(56) References Cited

U.S. PATENT DOCUMENTS

| | | | |
|---|---|---|---|
| 2015/0160089 A1* | 6/2015 | Dawson | ................ G01L 27/002 |
| | | | 73/1.59 |
| 2015/0191347 A1* | 7/2015 | Sato | .................... B81C 1/00166 |
| | | | 438/50 |
| 2020/0107130 A1* | 4/2020 | Cheng | .................. H04R 31/003 |

FOREIGN PATENT DOCUMENTS

| | | | |
|---|---|---|---|
| EP | 2994733 | B1 | 1/2018 |
| JP | H10170373 | A | 6/1998 |
| JP | 2015114318 | A | 6/2015 |
| JP | 2015129699 | A | 7/2015 |
| WO | 0005001 | A1 | 2/2000 |

* cited by examiner

MEMS SENSOR INCLUDING A DIAPHRAGM AND METHOD FOR MANUFACTURING A MEMS SENSOR

FIELD

The present invention relates to a MEMS sensor including a diaphragm.

The present invention further relates to a method for manufacturing a MEMS sensor.

Although the present invention is applicable in general to arbitrary MEMS sensors including a diaphragm, the present invention is described with reference to MEMS pressure sensors including a deflectably situated diaphragm.

BACKGROUND INFORMATION

MEMS pressure sensors are used today in a multitude of fields, for example, in the field of automotive technology, where pressures must be quickly and accurately detected, for example in the area of electronic stability control or in the intake air management in vehicles or the like.

German Patent Applicant No. DE 10 2016 107 275 A1 describes a method for carrying out a measurement using a MEMS device, which includes multiple MEMS sensors that have various resonance frequencies. The method includes applying an excitation signal at a first port of the MEMS device in such a way that each of the multiple MEMS sensors is stimulated by the excitation signal. The method further includes measuring a signal at a second port of the MEMS device and determining a measured value on the basis of the measurement of the signal. The MEMS device includes multiple pressure cells having walls made of the so-called "solid ground," above which pressure-sensitive rectangular diaphragms are situated.

European Patent No. EP 2 994 733 B1 describes a microelectromechanical pressure sensor structure which includes a housing structure and a diaphragm plate, the housing structure including a planar base and side walls, a first surface extending essentially along the planar base, the side walls extending as a periphery away from the planar base, the diaphragm plate extending along a second surface at the side walls, the planar base, the side walls and the diaphragm plate being attached to one another in such a way that the first surface, the second surface and the inner surfaces of the side walls form a hermetically sealed gap in a reference pressure, an upper edge of the inner surfaces of the side walls forming a periphery of a diaphragm, which has a length and a width in the direction of the second surface, the length extending in the direction of the longitudinal extension of the diaphragm and the width extending in a direction perpendicular to the direction of the length in the direction of the second surface, the pressure sensor structure including a fixed electrode at the first surface and a diaphragm electrode at the second surface in order to detect changes of the capacitance across the gap, and the length of the diaphragm being at least three times the width of the diaphragm and the pressure sensor structure including one or multiple recesses, which extend starting from the first surface into the planar base, the recesses being provided in one or in multiple recess areas at the first surface, a position in the recess area corresponding to a position in the second surface if a line connecting the positions is perpendicular to the plane of the first surface, the diaphragm being designed in such a way that it exhibits a maximum deflection that corresponds to a maximally allowable displacement of the diaphragm during operation, and the recess areas being provided at positions where the deflection of the diaphragm at a corresponding position is less than two thirds of the maximum deflection.

SUMMARY

In one specific embodiment, the present invention provides a MEMS sensor including a diaphragm, a base surface area of the diaphragm being delimited with the aid of a peripheral wall structure, and the base surface area including at least two subareas, of which at least one of the subareas is deflectably situated, and the at least two subareas are separated from one another by a separating structure or delimited by the latter and the separating structure including at least one fluid through-opening for the passage of a fluid.

In one further specific embodiment, the present invention provides a method for manufacturing a MEMS sensor, including the steps providing a diaphragm on a base structure, the diaphragm being spaced apart from the base structure via a wall structure, providing a base surface area of the diaphragm with at least two subareas, at least one of the subareas being deflectably situated, separating and/or delimiting the at least two subareas with the aid of at least one separating structure, and providing at least one fluid through-opening for the passage of a fluid in the separating structure.

The term "fluid" is understood, in particular, herein, to mean a liquid and/or a gas mixture, in particular, a gas.

One of the advantages achieved thereby is that the flexibility during the manufacture of various diaphragm shapes is significantly increased as a result. One further advantage is the simple and cost-effective manufacture of various diaphragm shapes on an easily manufacturable, large, regularly shaped diaphragm surface. One further advantage is that via the at least one fluid through-opening, in principle, a larger back volume, i.e., a hermetically sealed volume, may be utilized which, with respect to the stability of the pressure sealed therein, for example, regarding outgassing as well as the stability with respect to temperature changes or the like is significantly improved.

Further features, advantages and further specific embodiments of the present invention are described below or become apparent as a result.

According to one advantageous refinement of the present invention, the at least two subareas are situated symmetrically relative to one another on the base surface area and are, in particular, identically designed. This allows for a simple manufacture and arrangement of the at least two subareas.

According to one further advantageous refinement of the present invention, the separating structure includes at least one pillar. A simple manufacture of the separating structure with the simultaneous provision of a fluid through-opening is possible with the aid of the at least one pillar.

According to one further advantageous refinement of the present invention, the separating structure includes multiple pillars, which are situated at a regular distance, in particular, at respectively identical distances to one another. Thus, it is possible to also achieve a simple and cost-effective manufacture at the same time with a sufficient separation of the at least two subareas.

According to one further advantageous refinement of the present invention, the at least one pillar has an at least partially round and/or angled cross section, preferably trapezoidal, triangular, square and/or oval. The pillars may thus be manufactured in a flexible and simultaneously simple manner.

According to one further advantageous refinement of the present invention, the at least one pillar includes at least two sections that are differently designed. As a result, one pillar may also have various thicknesses and/or shapes, for example, in the z-direction/vertical direction. The pillars may, in particular, include one or multiple steps or the like or have a tapered design or the like in the z-direction.

According to one further advantageous refinement of the present invention, at least two of the pillars have different diameters. This further improves the flexibility of the separating structure. Thus, for example, pillars close to a wall or wall structure may have a thinner design, since in this area the wall serves as additional support, whereas in the center area it may have a stronger, i.e., thicker design. In addition, the behavior, in particular in the case of a deflectable diaphragm, its oscillation behavior, may also be influenced to a certain extent by changing the pillars.

According to one further advantageous refinement of the present invention, the at least two subareas are rectangular. Thus, it is possible in a simple manner to provide multiple sub-diaphragms from one square base surface area.

According to one further advantageous refinement of the present invention, the wall structure and/or the separating structure is/are manufactured from two different materials. This enables a flexible adaptation to different criteria, for example, stability or the like.

According to one further advantageous refinement of the present invention, the separating structure and/or the wall structure is/are manufactured from diaphragm material and/or from insulation material and/or from electrically conductive material. Thus, it is possible in a simple manner to employ a MEMS manufacturing method in order to manufacture the separating structure and the wall structure.

According to one further advantageous refinement of the present invention, a first electrode structure for forming a first capacitance and a second electrode structure for forming a second capacitance is/are situated in at least one subarea, the two electrode structures being spaced apart from one another with the aid of the separating structure. Thus, a peripheral capacitance and an inner capacitance may, for example, be provided, which have different deflection behavior, because the outer areas of a diaphragm, in particular, which are connected to the wall structure or, in particular, to a solid ground in general less than the area in the center of the diaphragm. In this way, a reference capacitance may be easily provided.

According to one further advantageous refinement of the present invention, at least one of the at least two subareas is designed as a reference capacitance. Thus, a reference capacitance may be easily provided by two different subareas.

Further important features and advantages of the present invention result from the description herein, from the figures and from associated figure descriptions with reference to the figure.

It is understood that the features cited above and the features still to be explained below are usable not only in the respectively indicated combination, but also in other combinations or when considered alone, without departing from the scope of the present invention.

Preferred designs and specific embodiments of the present invention are depicted in the figures and are explained in greater detail in the following description, identical reference numerals referring to identical or similar or functionally identical components or elements.

DETAILED DESCRIPTION OF EXAMPLE EMBODIMENTS

Figure 1:
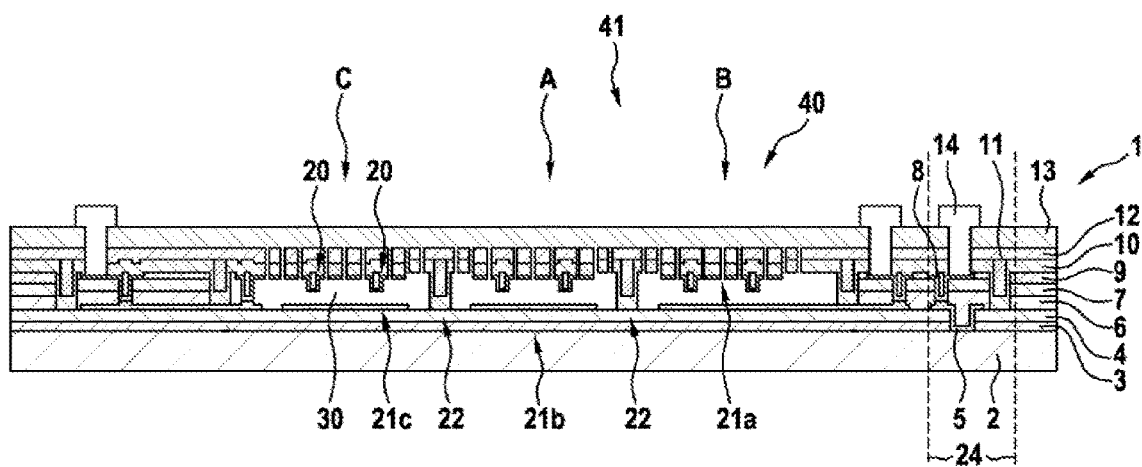
FIG. 1 shows a MEMS sensor in cross section according to one specific embodiment of the present invention.

FIG. 1 shows a MEMS sensor in cross section according to one specific embodiment of the present invention.

A MEMS sensor is shown in detail in FIG. 1, which has been manufactured, for example, in the following manner: in a first step, an oxide layer 3 has been initially applied to a silicon wafer 2. In this case, substrate 2 may optionally be doped in order to improve the electrical shielding effect. A layer 4, in particular, a diaphragm layer made of silicon-rich nitride—SiRiN—has subsequently been deposited and, together with oxide layer 3 subsequently structured, so that a substrate contact has been facilitated. A lower electrode 5 has subsequently been manufactured via deposition of polycrystalline silicon, which has subsequently been structured. In the process, the substrate contact is filled with a conductive polycrystalline silicon. A lower, first sacrificial layer in the form of an oxide layer 6 has then been deposited and subsequently structured and, in particular, additionally planarized by chemical-mechanical polishing. A second oxide layer 7 has then been deposited and structured in order to create stop structures. Polycrystalline silicon 8 has been subsequently deposited and subsequently structured in order to manufacture an upper electrode 8. Thereafter, a third oxide layer 9 has been deposited and planarized. Subsequently, a structuring for posts, i.e., support elements in the form of pillars 22 and for walls 23 has been created. Diaphragm material 10 in the form of silicon-rich nitride—SiRiN—has then been deposited. Thereafter, a fourth oxide layer 11 has been deposited and planarized via chemical-mechanical polishing in order to create an oxide filling in posts or pillars 22 and in walls 23. Final diaphragm material 12 has subsequently been deposited and structured together with upper electrode layer 8 in order to obtain one or multiple etching accesses to sacrificial layers 6, 7, 9. Thereafter, sacrificial layers 6, 7, 9 have then been stripped by gas phase etching or with the aid of a stiction-free wet release process and diaphragm 10, 12 has been exposed. It is advantageous if no metal surfaces have to be impacted by the exposure process, so that undesired effects, for example, deposit formation on metal pads during gas phase etching or etching of metal pads in the wet release process, provided no gold pads are used or the like, are avoided. A stress-adapted SiN layer 13 has subsequently been deposited at a correspondingly predefined process pressure. This has subsequently been structured for contact pads. A further thin polysilicon layer, having a film thickness of approximately 100 nm may subsequently optionally be deposited on the upper side of SiN layer 13 and structured. This may optionally provide an electrical shield similar to that of substrate 2. A metal plane has been subsequently deposited and subsequently structured for manufacturing contact pads 14. The manufacture of MEMS sensor 1 including a deflectable diaphragm is thereby essentially completed.

Here, stop structures are identified with reference numeral 20, one electrode pair each including a lower and upper electrode in respective subarea A, B, C are identified with reference numeral 21a, 21b, 21c, corresponding connection elements or pillars are identified with reference numeral 22 and walls of cavity 30 produced by stripping the sacrificial layers are identified with reference numeral 23. The guiding of the electrical contact through walls 23 is depicted to the right in FIG. 1 only for lower electrode 5. In area 24 to the right of diaphragm 8, 10, a contacting of substrate 2 is made possible via contact pads 14. For a 350×350 µm base surface area 41, for example, the following division into subareas and/or sub-shapes of base surface area 41 may be provided overall for diaphragm 40. Other sizes of base surface area 41 are equally possible.

1. Square large diaphragm 40 having a side length up to 350×350 µm.
2. Multiple square sub-diaphragms having side lengths up to approximately 160×160 µm.
   Here, the usable surface area for diaphragm 40 in relation to the square base surface area 41 is reduced, since additional circuitry complexity and separations between the sub-diaphragms reduce the usable surface area for diaphragm 40.
3. Round diaphragm 40 having a diameter of up to 350 µm
4. Multiple round sub-diaphragms having diameters up to approximately 160 µm
5. Multiple rectangular sub-diaphragms having side lengths up to approximately 320 µm and a side length ratio greater than 2:1.

Figure 2:
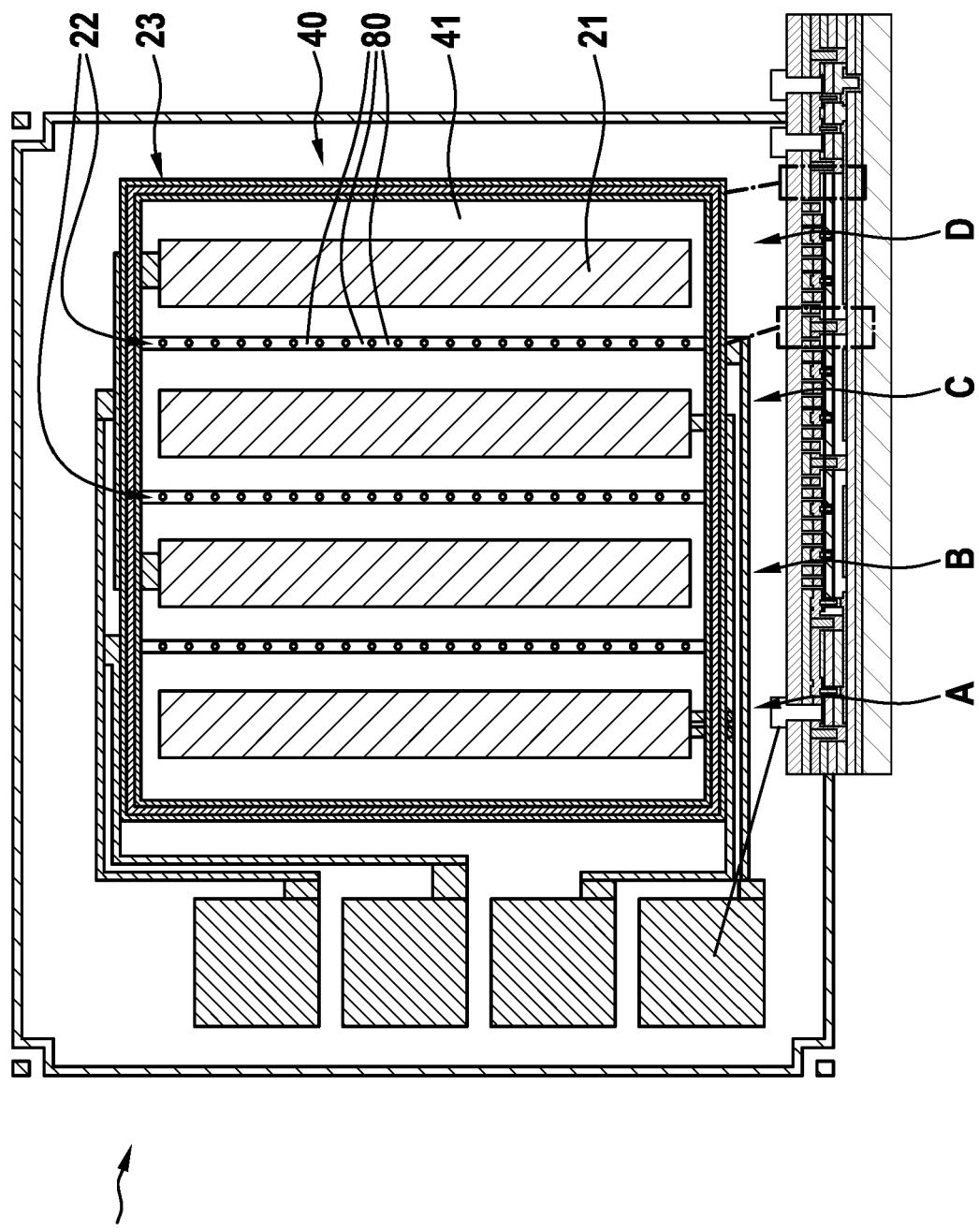
FIG. 2 shows a top view of a MEMS sensor according to one specific embodiment of the present invention.

FIG. 2 shows a top view of a MEMS sensor according to one specific embodiment of the present invention.

In FIG. 2, a MEMS sensor 1 is shown including a diaphragm 40, which has a square base surface area 41. Four subareas A, B, C, D of diaphragm 40 are also shown, each of which has a rectangular and deflectable design. Rectangular areas A, B, C, D are situated in the interior of square base surface area 41 and separated from one another within base surface area 41 by punctiform pillars 22 situated on lines. Square base surface area 41 is delimited by extended peripheral walls 23 which, like punctiform pillars 22 as well, may in particular, be made of an oxide-filled diaphragm material. Punctiform pillars 22 in this case may have a round, angular and/or square cross section and may be situated at a distance in each case between 10 µm and 50 µm in parallel to the long side of rectangular areas A, B, C, D. Openings or fluid through-openings 80 between subareas A, B, C, D are made possible with the aid of pillars 22, so that a fluid connection is made possible between the spaces below respective subareas A, B, C, D. One electrode pair 21 each is situated in the interior of subareas A, B, C, D.

Figure 3:
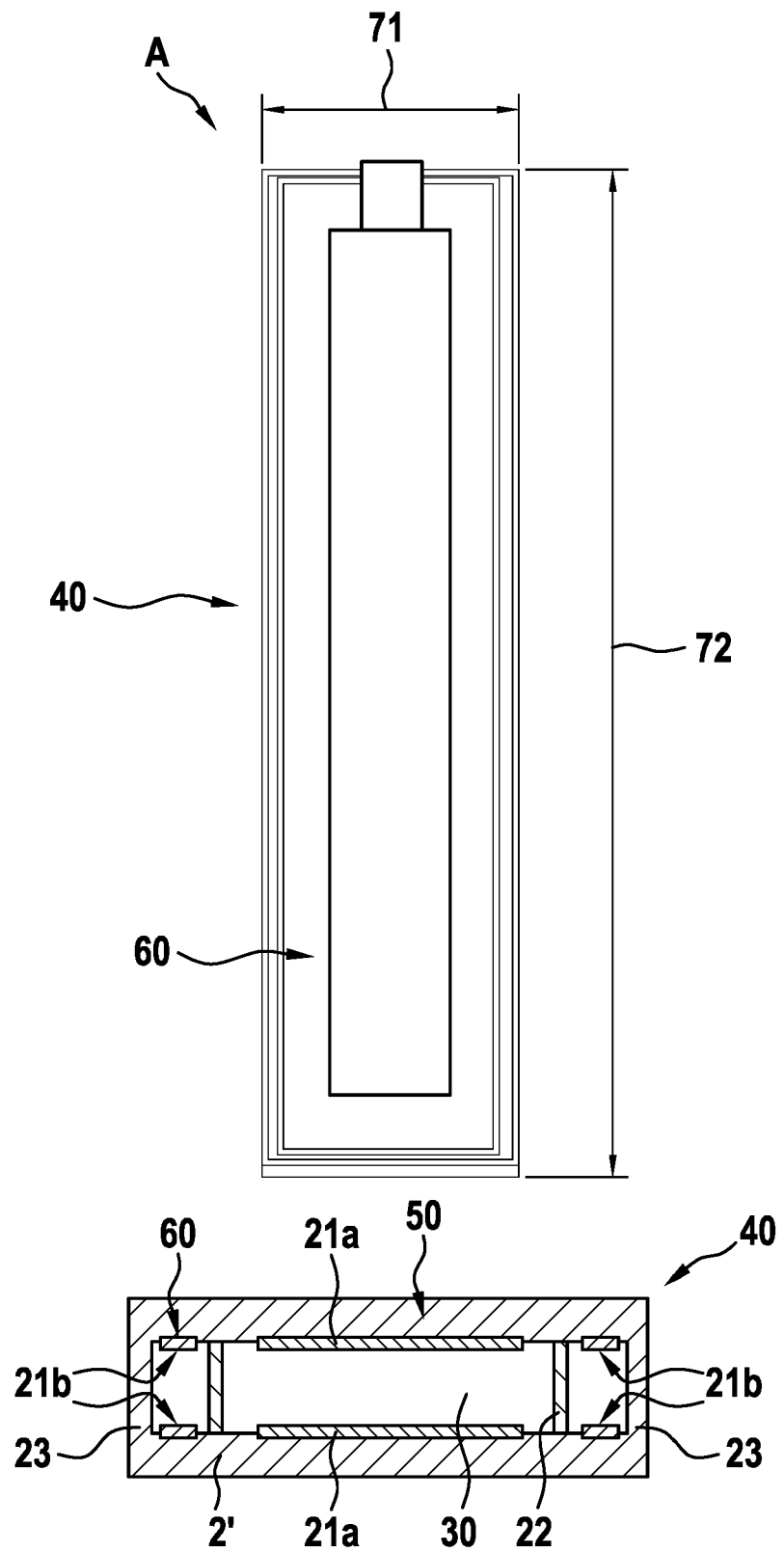
FIG. 3 shows a top view and a cross section through a portion of a MEMS sensor according to one specific embodiment of the present invention.

FIG. 3 shows a top view and a cross section through a portion of a MEMS sensor according to one specific embodiment of the present invention.

A top view of a subarea A of a diaphragm 40 is shown in detail in the upper area in FIG. 3, a cross section is shown in the lower area of FIG. 3. Diaphragm 40 is spaced apart from a base structure 2' via a wall structure 23. Base structure 2', wall structure 23 and diaphragm 40 enclose in this case a cavity 30. An electrode pair 21a for forming a first capacitance 50 is situated on the upper side of base structure 2' and on the lower side of diaphragm 40. Electrode pair 21a in this case is situated essentially in the center between the left and right portions of wall structure 23. Two laterally vertical support structures 22 each are situated between first electrode pair 21a and the left and right portion of wall structure 23. One second electrode pair 21b each is situated on the upper side of base structure 2' and the lower side of diaphragm 40 between the two support structures 22 and the respective left and right portion of wall structure 23. This forms a second capacitance 60, for example, a reference capacitance. In this case, dimensions 71, 72 of subarea A are approximately 320 micrometers as length 72 and approximately 70 to 80 micrometers as width 71.

Figure 4:
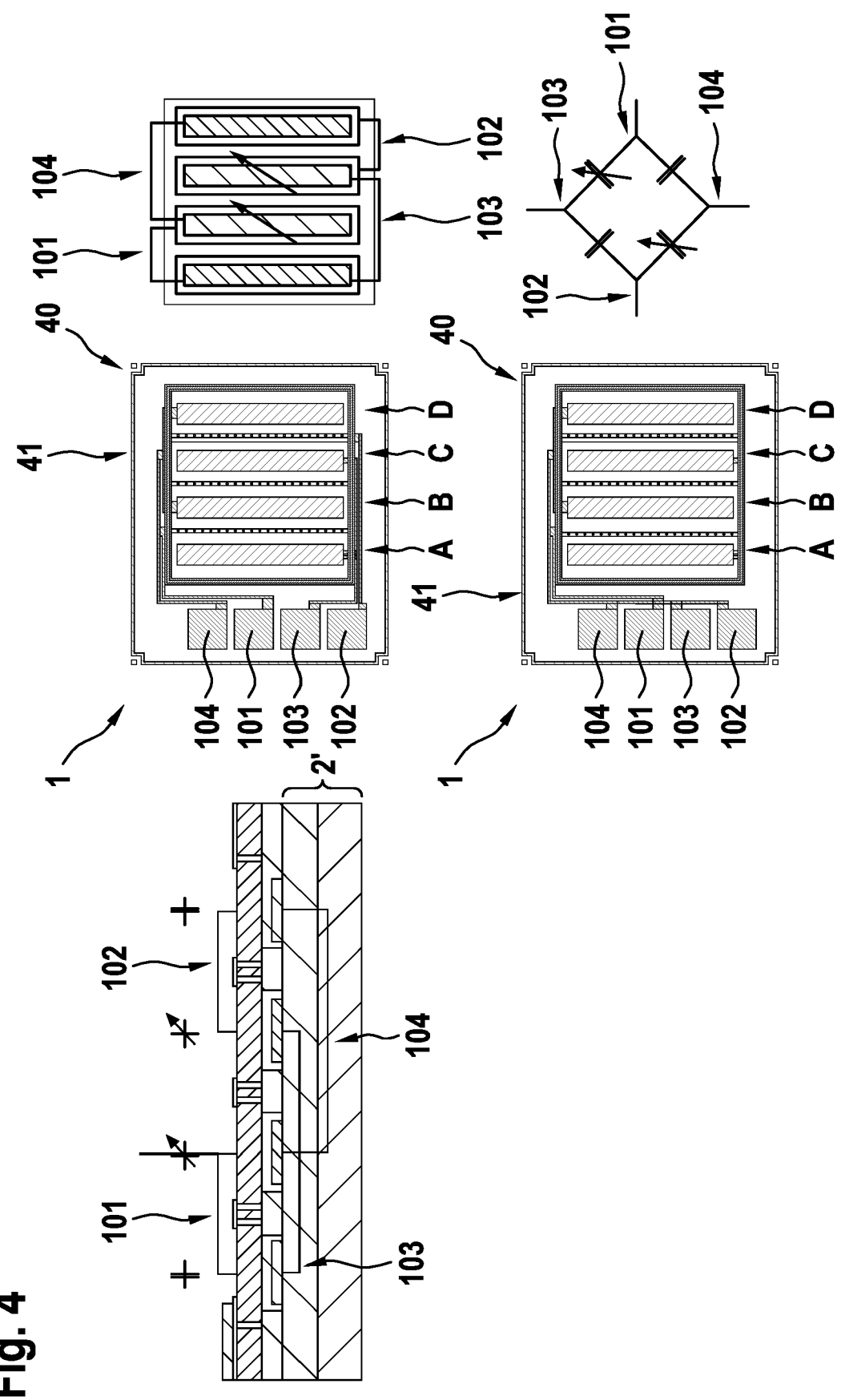
FIG. 4 shows a MEMS sensor according to specific embodiments of the present invention.

FIG. 4 shows MEMS sensors according to specific embodiments of the present invention.

In FIG. 4, various MEMS sensors 1 are shown in the center of FIG. 4, each of which includes a diaphragm 40 having a base surface area 41, each diaphragm 40 including in each case sub-diaphragm surface areas A, B, C, D. Here, electrode pairs are situated in each case on the lower side of diaphragm 40 and on the upper side of a base structure 2', as is depicted in the sectional view on the left side of FIG. 4. The four sub-diaphragm surface areas A, B, C, D each have a size of 320 µm×72 µm and the distance between subareas A, B, C, D is 10 µm. Electrodes 101, 102 are now interconnected with one another as upper electrodes via the four sub-diaphragm surface areas A, B, C, D and electrodes 103, 104 as lower electrodes according to the diagram shown on the right side of FIG. 4. Lower electrodes 103, 104 in different subareas A, B, C, D and/or upper electrodes 101, 102 in different subareas A, B, C, D may, in particular, be interconnected with one another to form capacitances and/or reference capacitances. In one of the specific embodiments of FIG. 4, two reference capacitances and two variable capacitances are formed, the two variable capacitances—depicted in each case by diagonal arrows—being formed by the two areas B and C in the center of diaphragm 40.

It is equally possible that upper electrode areas 101, 102 and lower electrode areas 103, 104 only partially overlap. In such a specific embodiment, these electrode areas may also be designed geometrically asymmetrically relative to one another. One of the advantages, among others, of such a shown interconnection is an electrical symmetrization of pressure-sensitive measuring capacitance and pressure-insensitive reference capacitance. It is possible with an electrically asymmetrical design of pressure-sensitive measuring capacitance and pressure-insensitive reference capacitance, to adapt these to an evaluation circuit.

A geometric optimization with respect to stray electrical fields or electrical parasites may further also be enabled thereby.

Figure 5:
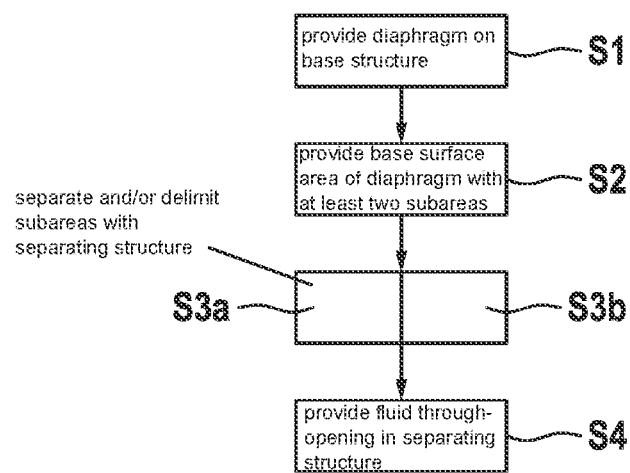
FIG. 5 shows a method according to one specific embodiment of the present invention.

FIG. 5 shows a method according to one specific embodiment of the present invention.

A method for manufacturing a MEMS sensor is shown in FIG. 5 with reference numerals of FIG. 1.

In this method, a diaphragm 40 is provided on a base structure 2, 3, 4 in a first step S1, diaphragm 40 being spaced apart from base structure 2, 3, 4 via a wall structure 23.

In a second step S2, a base surface area 41 of diaphragm 40 is furthermore provided with at least two subareas A, B, C, D, at least one of subareas A, B, C, D, being deflectably situated.

In a third step S3a and/or S3b, the at least two subareas are furthermore separated and/or delimited with the aid of at least one separating structure 22.

In a fourth step S4, at least one fluid through-opening 80 for the passage of a fluid is furthermore provided in separating structure 22.

On the whole, at least one of the specific embodiments of the present invention enables the following features and/or yields the following advantages:

- Concatenation of virtually rectangular individual diaphragms within a square diaphragm surface area, an increase of the ratio of a capacitance arrangement to base capacitance $\Delta C/C_0$ with a reduction of base capacitance $C_0$ capable of being facilitated, which is advantageous.
- Concatenation of polygonal individual diaphragms within a square base surface area.
- Concatenation of virtually rectangular individual diaphragms within a square diaphragm surface area, for example, trapezoidal, polygonal, oval with aspect ratios of greater than or equal to 2:1 with respect to edge length to edge width.
- Separation of the individual diaphragms by oxide-filled walls made of diaphragm material.
- Separation of the individual diaphragms by oxide-filled punctiform pillars made of diaphragm material, for example, round, angled, triangular, polygonal or the like.
- Mechanical reinforcement of the pressure-sensitive reference capacitances by pillars in the interior electrically active area of the diaphragm.
- Variable mechanical reinforcement of the pressure-sensitive measuring capacitances by pillars or walls.
- Variable mechanical support of diaphragms by pillars having a round, polygonal, square or triangular geometry.
- Variable mechanical support of diaphragms by pillars and walls having variable diameters of 2 μm to 20 μm.
- Peripheral capacitances including another use capacitance in the interior and their separation by support structures.

The present invention, although it has been described with reference to preferred exemplary embodiments, is not limited thereto, but is modifiable in a variety of ways.

What is claimed is:

1. A MEMS sensor, comprising:
    a diaphragm, wherein a base surface area of the diaphragm is delimited via a peripheral wall structure, wherein the base surface area of the diaphragm includes at least two subareas, wherein the diaphragm is deflectable within at least one of the subareas, wherein the at least two subareas are (i) separated from one another via at least one separating structure or (ii) delimited by the at least one separating structure, wherein the separating structure includes at least one fluid through-opening for the passage of a fluid, wherein a first electrode structure for forming a first capacitance and a second electrode structure for forming a second capacitance are situated in at least one subarea of the at least two subareas, the first and second electrode structures spaced apart from one another using the separating structure, and wherein at least one of the at least two subareas being configured as a reference capacitance.

2. The MEMS sensor as recited in claim 1, wherein the at least two subareas are situated symmetrically relative to one another on the base surface area and are identically designed.

3. The MEMS sensor as recited in claim 1, wherein the separating structure includes at least one pillar.

4. The MEMS sensor as recited in claim 1, wherein the separating structure includes multiple pillars, which are situated at a respectively identical distance from one another.

5. The MEMS sensor as recited in claim 3, wherein the at least one pillar has an at least partially round and/or angular cross section.

6. The MEMS sensor as recited in claim 5, wherein the cross section is trapezoidal and/or triangular and/or square and/or oval.

7. The MEMS sensor as recited in claim 3, wherein the at least one pillar includes at least two sections which are differently designed.

8. The MEMS sensor as recited in claim 4, wherein at least two of the pillars have a different diameter.

9. The MEMS sensor as recited in claim 1, wherein the at least two subareas have a rectangular design.

10. The MEMS sensor as recited in claim 1, wherein the wall structure and/or the separating structure is manufactured from two different materials.

11. The MEMS sensor as recited in claim 10, wherein the separating structure and/or the wall structure is manufactured from diaphragm material and/or from insulation material and/or from electrically conductive material.

12. A method for manufacturing a MEMS sensor, comprising the following steps:
    providing a diaphragm on a base structure, the diaphragm being spaced apart from the base structure via a wall structure;
    providing a base surface area of the diaphragm, wherein the base surface area of the diaphragm includes at least two subareas, wherein the diaphragm is deflectable within at least one of the subareas;
    separating and/or delimiting the at least two subareas using at least one separating structure; and
    providing at least one fluid through-opening in the separating structure for the passage of a fluid;
    wherein:
        a first electrode structure for forming a first capacitance and a second electrode structure for forming a second capacitance are situated in at least one subarea, the first and second electrode structures being spaced apart from one another using the separating structure, and
        at least one of the at least two subareas is configured as a reference capacitance.

\* \* \* \* \*